United States Patent
Bhawmik

[11] Patent Number: 5,680,543
[45] Date of Patent: Oct. 21, 1997

[54] METHOD AND APPARATUS FOR BUILT-IN SELF-TEST WITH MULTIPLE CLOCK CIRCUITS

[75] Inventor: Sudipta Bhawmik, Princeton, N.J.

[73] Assignee: Lucent Technologies Inc., Murray Hill, N.J.

[21] Appl. No.: 546,055

[22] Filed: Oct. 20, 1995

[51] Int. Cl.$^6$ .................................................. G06F 11/27
[52] U.S. Cl. ..................... 395/183.06; 371/22.5; 395/556
[58] Field of Search ........................... 395/550, 566, 395/183.06, 183.08, 183.09, 183.1, 185.08; 371/22.5

[56] References Cited

U.S. PATENT DOCUMENTS

| | | | |
|---|---|---|---|
| 5,533,032 | 7/1996 | Johnson | 371/22.5 |
| 5,570,374 | 10/1996 | Yau et al. | 371/22.5 |
| 5,574,733 | 11/1996 | Kim | 371/22.5 X |

OTHER PUBLICATIONS

Benoit Nadeau–Dostie, Dwayne Burek, Abu S.M. Hassan, "ScanBist: A Multifrequency Scan–Based BIST Method," IEEE Design & Test of Computers, Spring 1994, vol. 11, No. 1, pp. 7–17.

Chih–Jen Lin, Yervant Zorian, Sudipta Bhawmik, "PSBIST: A Partial Scan Based Built–In Self Test Scheme," Proc. of International Test Conference, Baltimore, MD, 1993.

*Primary Examiner*—Thomas M. Heckler
*Attorney, Agent, or Firm*—Robert B. Levy

[57] ABSTRACT

Built-In Self-Testing of multiple scan chains ($12_1$–$12_n$) can be accomplished by providing separate clock signals ($CK_1$–$CK_n$) that are scheduled by a control circuit (22) so that each chain is clocked at its rated frequency.

7 Claims, 2 Drawing Sheets

SCAN

NORMAL MODE

METHOD AND APPARATUS FOR BUILT-IN SELF-TEST WITH MULTIPLE CLOCK CIRCUITS

TECHNICAL FIELD

This invention relates to a technique for operating a Built-InSelf Test Circuit having multiple clock regimes to permit each regime to be clocked at its rated operating speed.

BACKGROUND ART

Built-In Self-Testing (BIST) circuitry has been incorporated within integrated circuits (chips), circuit boards and entire systems to facilitate testing without the need for complex external test equipment. The presence of such BIST circuitry allows the host incorporating such circuitry to internally generate its own test vectors and to internally observe its own response signals to such test vectors. The only stimuli required by the BIST circuitry is an external clock signal to clock the circuitry at its appropriate operating speed.

For a host that has a single clock regime (i.e., the host operates at a single clock frequency), providing the appropriate clock signal to the BIST circuitry within the host is generally straightforward. However, some hosts have multiple clock regimes (i.e., such hosts require multiple clock signals). Accomplishing Built-In Self-Testing of a host that has multiple clock regimes can prove hazardous, in terms of damage to test data, if proper care is not taken. For instance, clocking a clock regime of a BIST circuit within a host at a rate higher than its maximum rate can distort or corrupt the BIST data. On the other hand, clocking the clock regime of the BIST circuit below its clock rate may not yield accurate test results.

Thus, there is a need for a scheme for clocking multiple clock-regimes within a BIST circuit.

BRIEF SUMMARY OF THE INVENTION

Briefly, in accordance with the invention, a method is proposed for clocking a BIST circuit having n separate clock regimes $C_1, C_2 \ldots C_n$, (where n is an integer), each successive clock regime $C_{i+1}$ having an associated clock frequency $f_{i+1}$ that is less than the clock frequency $f_i$ associated with the previous clock regime $C_i$. The invention is practiced by clocking each of the clock regimes $C_1-C_i$ at with a clock signal $CK_i$ at a frequency $f_i$, while maintaining the clock regimes $C_{i+1}-C_n$ constant, as i increases from 1 to n. Thus, for example, a BIST circuit having three clock regimes $C_1$, $C_2$ and $C_3$ that operate at frequencies of 64 MHz, 32 MHz and 8 MHz, respectively, initially would have its clock regime $C_1$ clocked by a clock signal $CK_1$ at 64 MHz while the clock regimes $C_2$ and $C_3$ are kept constant. Thereafter, the clock regimes $C_1$ and $C_2$ are clocked by a clock signal $CK_2$ at 32 MHz while the clock regime $C_3$ is kept constant. Finally, the clock regimes $C_1$, $C_2$ and $C_3$ are all clocked with a clock signal $CK_3$ at 8 MHz. By clocking the BIST circuit in this fashion, each clock regime is clocked at is rated clock frequency without incurring any harm to the clock regimes having a slower clock frequency.

In accordance with another aspect of the invention, it may be deskable, to the extent that there are conflicts between the clock regimes $C_1-C_n$, to sequentially clock each regime while holding the successive regimes constant. Thus, the clock regime $C_1$ would initially be clocked at frequency $f_i$ while the regimes $C_2-C_n$ are held constant. Next, the clock regimes $C_1$ and $C_2$ would be clocked in sequence at frequencies $f_1$ and $f_2$, respectively, while the remaining regimes are held constant. Thereafter, the clock regimes $C_1$, $C_2$, and $C_3$ would be clocked in sequence at frequencies $f_1, f_2$ and $f_3$, respectively, and so on until each of the clock regimes is sequentially clocked at its corresponding clock frequency.

DETAILED DESCRIPTION

Figure 1:
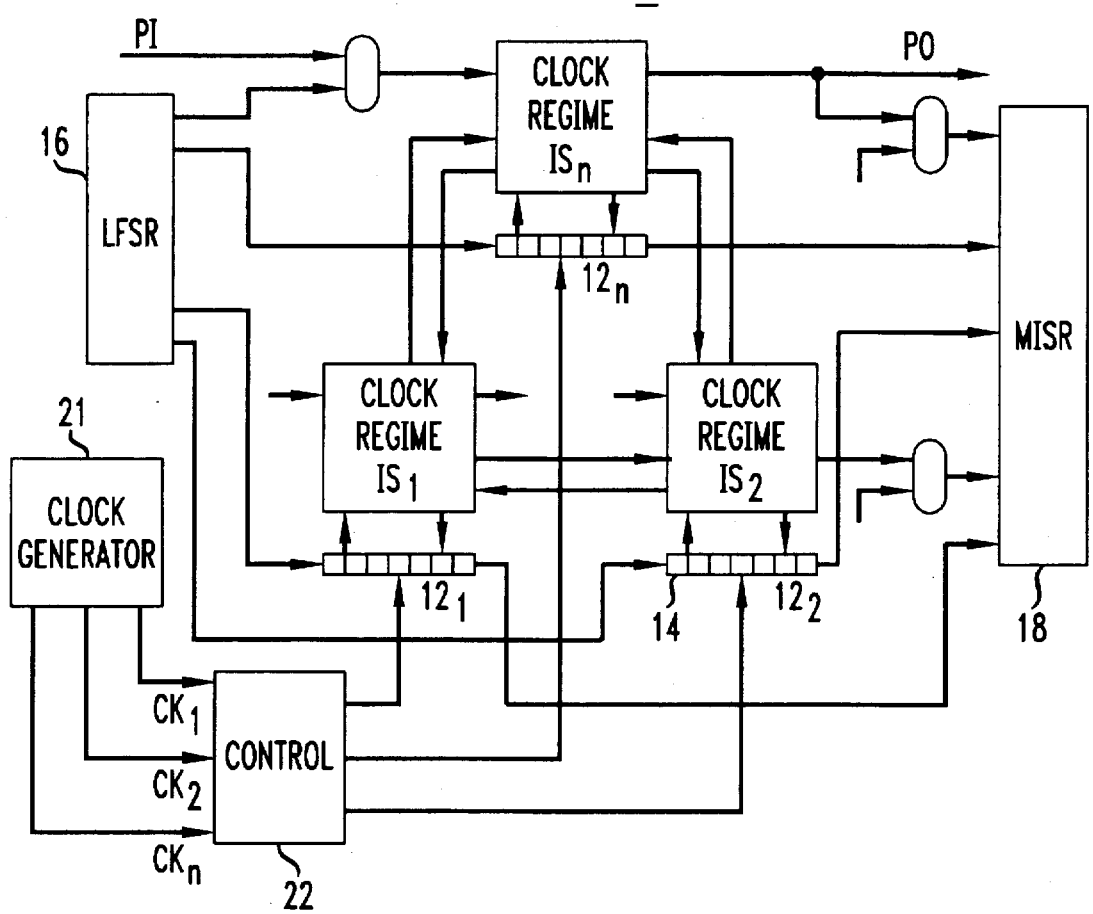
FIG. 1 shows a block schematic diagram of a multiple-clock regime scan-based BIST circuit that is clocked in accordance with the invention.

FIG. 1 illustrates a block schematic diagram of a BIST circuit 10 for incorporation with a host (not shown), such as an integrated circuit, a circuit board or an entire system. The BIST circuit 10 includes at least one, and preferably, a plurality of scan chains $12_1, 12_2 \ldots 12_n$, where n is an integer>0. In the illustrated embodiment, n=3 although it should be understood that a larger or smaller number of such chains may be present. Each of the scan chains $12_1-12_n$ comprises at least one, and a plurality of individual registers 14—14 serially coupled to each other. Each register 14 in each scan chain is connected to the host containing the BIST circuit 10 through a corresponding one of clock regime circuits $15_1-15_n$ so that the data value within the register is influenced by the operation of the host. In practice, each oft he clock regime circuits $15_1-15_n$ may comprise either a combinational or sequential circuit.

In addition to the scan chains $12_1-12_n$, the BIST circuit 10 includes a Linear Feedback Shift Register (LFSR) 16 for generating strings of test values for shifting into the scan chains. The BIST circuit 10 also includes a Multiple Input Shift Register (MISR) 18 that receives the strings of test values stored by of the scan chains $12_1-12_n$. The MISR 18 functions to compact or logically combine the strings of values from the scan chains $12_1-12_n$ to yield a reduced-length value string indicative of the entity tested by the BIST circuit 10. Although not shown, each of the scan chains $12_1-12_n$ could be provided with its own LFSR and MISR.

Each of the scan chains $12_1-12_n$, together with the associated one of its clock regime circuits $15_1-15_n$, operates a separate one clock frequencies $f_1-f_n$ such that $f_1>f_2>f_3 \ldots >f_n$. Upon receipt of a corresponding one of clock signals $CK_1-CK_n$ (at corresponding frequencies $f_1-f_n$, respectively), each of the scan chains $12_1-12_n$ shifts in test values from the LFSK 16. At the completion of testing, the scan chains $12_1-12_n$ shift out their stored test values to the MISR 18. In the embodiment depicted in FIG. 1, the scan chains $12_1, 12_2$ and $12_n$, are clocked with clock signals $CK_1$, $CK_2$ and $CK_n$ that have a frequency of 64 MHz, 32 MHz and 8 MHz, respectively, although it should be understood that different frequency clock signals may be readily employed.

Heretofore, clocking the scan chains $12_1-12_n$ at the appropriate clock frequencies $f_1-f_n$, respectively, has proved problematic. Clocking all of the scan chains $12_1-12_n$ at the lowest common frequency $f_n$ will avoid damage to the logical values stored in the scan chains that would otherwise occur if any chain was clocked in excess of its rated clock frequency. However, this approach would not facilitate testing of the scan chains $12_1$–$12_{n-1}$ at their rated frequency. Clocking the scan chains $12_1$–$12_n$ at their rated clock frequencies $f_1$–$f_n$, respectively, simultaneously would likely give rise to conflicts that might adversely affect the information shifted out of one or more chains.

In accordance with the invention, a method is provided for scheduling the clocking of the scan chains $12_1$–$12_n$, to allow each chain to be clocked at its rated frequency while avoiding potential conflicts. In general terms, the clocking method of the present invention is practiced by clocking the scan chains $12_1$–$12_i$ at a clock frequency $f_i$, while maintaining clock signal to the scan chains $12_{i+1}$–$12_n$ constant, for successive values of i. Thus, the scan chain $12_1$ is initially clocked at its rated frequency $f_1$ while the clock signals supplied to the remaining scan chains $12_1$–$12_n$ are held at constant values. Thereafter, the scan chains $12_1$ and $12_2$ are clocked at a clock frequency $f_2$ while the clock signals supplied to the remaining scan chains $12_3$–$12_n$ are held constant. The scan chains $12_1$–$12_i$ are successively clocked in this manner as i increases monotonically from 1 until n at which time, the scan chains $12_1$–$12_n$ will all have been clocked at the clock frequency $f_n$.

To facilitate scheduling in this manner, the BIST circuit 10 of FIG. 1 includes a clock generator circuit 21 for generating a set of clock signals CK1–$CK_n$ each at a corresponding one of the rated clock frequencies $f_1$–$f_n$, associated with the scan chains $12_1$–$12_n$, respectively. The clock generator circuit 21 may comprise a single clock (not shown) together with appropriate divider circuits for yielding the clock signals CK1–$CK_n$. Rather than provide a separate clock generator circuit for this purpose, the clock signals CK1–$CK_n$ could be derived from the host.

Figure 2:
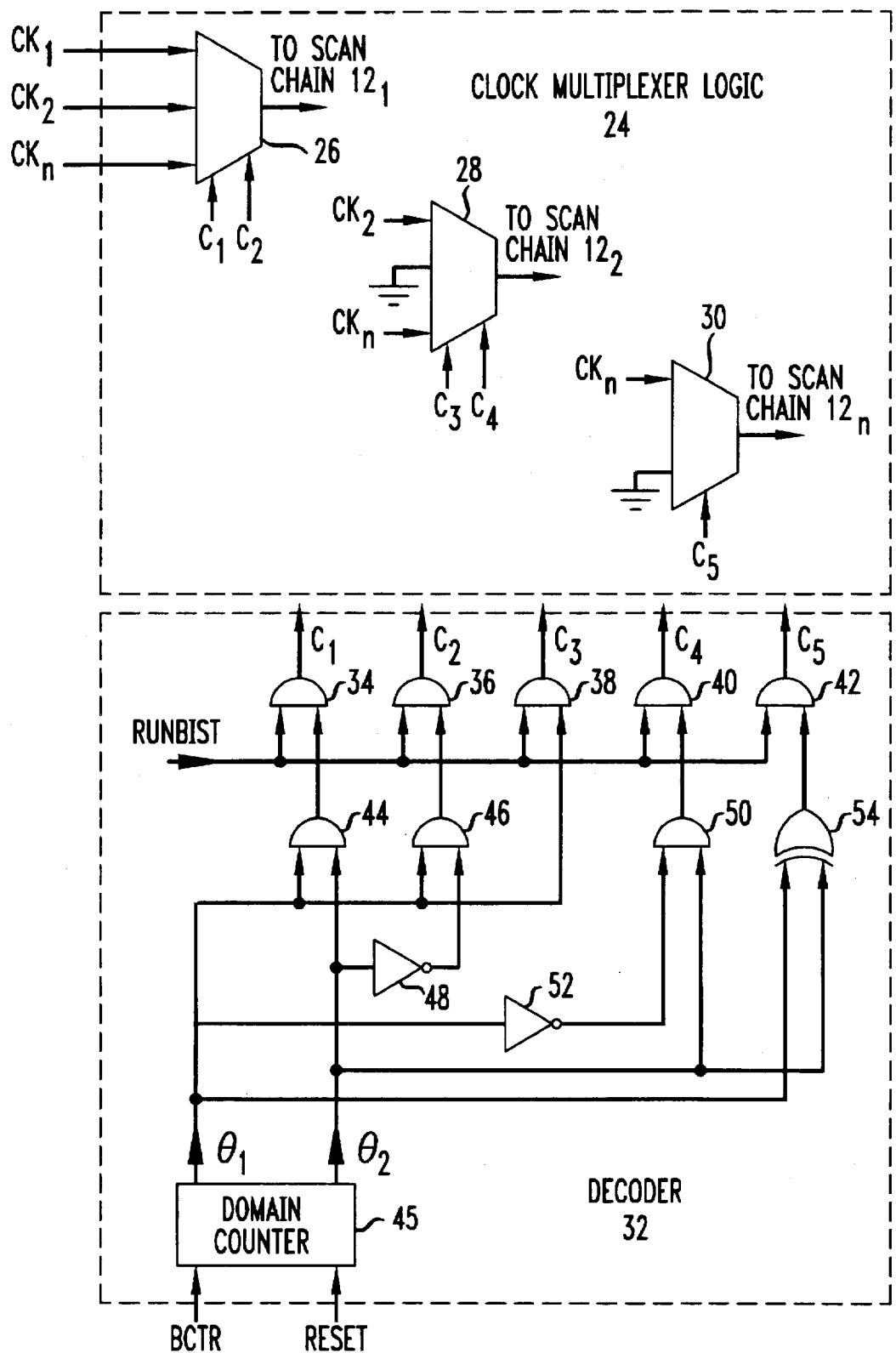
FIG. 2 shows a block schematic diagram of a control circuit associated with the circuit of FIG. 1.

The clock signals CK1–$CK_n$, are appropriately supplied to the scan chains $12_1$–$12_n$ according to a prescribed schedule by a clock control circuit 22 whose details are shown in FIG. 2. Referring to FIG. 2, the control circuit 22 includes a clock multiplexer circuit 24, which, in the illustrated embodiment, comprises two three-input multiplexers 26 and 28, and a two-input multiplexer 30. (As will be appreciated, each clock regime will have its associated multiplexer within the clock multiplexer 24 so that a BIST circuit containing a larger number of clock regimes will have a greater number of multiplexers.) The multiplexer 26 is supplied at each of its three inputs 0, 1 and 2 with the clock signals $CK_1$, $CK_2$ and $CK_n$, respectively, generated by the clock generator circuit 21 of FIG. 1. The multiplexer 26 is controlled by a decoder 32, described hereinafter, so that during a first, second and third test intervals, the multiplexer passes a separate one of the clock signals $CK_1$, $CK_2$ and $CK_n$, respectively, to the scan chain $12_1$. In this way, the scan chain $12_1$ is clocked at 64 MHz, 32 MHz and 8 MHz during the first, second and third test intervals, respectively.

The multiplexer 28 has its first and third inputs (0 and 2) supplied with the clock signals $CK_2$ and $CK_n$, respectively, while the second multiplexer input (1) is grounded. Like the multiplexer 26, the multiplexer 28 is also controlled by the decoder 32. During the second and third test intervals, the decoder 32 causes the multiplexer 28 to pass the clock signals $CK_2$ and $CK_n$ to the scan chains $12_1$ and $12_n$, respectively. However, during the first interval, the decoder 32 causes the multiplexer to pass the ground-level signal at its second input to the scan chain $12_2$ so the frequency of the clock signal received by that during the first interval remains constant.

The multiplexer 30 has its first input (0) supplied with the clock signal $CK_n$ from the clock generator circuit 21 while the second input of the multiplexer is grounded. Like the multiplexers 26 and 28, the multiplexer 30 is also controlled by the decoder 32. During the first and second test intervals, the decoder 32 controls the multiplexer 30 so that its output signal, representing the clock signal supplied to scan chain $12_n$, remains constant. However, during the third test interval, the decoder 32 causes the multiplexer to pass the clock signal $CK_n$ from the clock generator circuit 21 of FIG. 1 to the scan chain $12_n$ so this scan chain is clocked at a frequency $f_n$ (8 MHz).

As may be appreciated, the decoder 32 controls the multiplexers 26, 28 and 30 so that during the first interval, the scan chain $12_1$ alone is clocked by the signal $CK_1$. During the second interval, the scan chains $12_1$ and $12_2$ are both clocked by the clock signal $CK_2$. During the third interval, the scan chains $12_1$–$12_n$ are all clocked by the clock signal $CK_n$. In this way, each scan chain is clocked at its rated frequency without adversely impacting the scan chains that operate at lower frequencies.

Referring to FIG. 2, the decoder 32 includes five two-input AND gates 34, 36, 38, 40 and 42 that produce control signals $c_1$, $c_2$, $c_3$, $c_4$, and $c_5$, respectively, at their outputs. The control signals $c_1$ and $c_2$ from the AND gates 34 and 36, respectively, control the multiplexer 26. The control signals $c_3$ and $c_4$ from the AND gates 38 and 40, respectively, control the multiplexer 28. The control signal $c_5$ produced by the AND gate 42 controls the multiplexer 30.

The AND gates 34–42 each receive a signal RUNBIST at a first input. The RUNBIST signal transitions to an active high level when the BIST circuit of FIG. 1 becomes operative to test its host. The AND gate 34 receives at its second input the output of an AND gate 44 whose first and second inputs receive first and second output bits $\phi_1$ and $\phi_2$, respectively, of a 2-bit domain counter 45. The counter 45, when triggered by a signal BCTR, generates a two-bit count: (0 0), (0 1), (1 0), (1 1) and so on until the counter is reset by a reset signal RESET.

The AND gate 36 that generates the control signal $c_2$ has its second input supplied with the output signal of an AND gate 46. The AND gate 46 receives the first bit $\phi_1$ of the counter 45 at its first input and receives at its second input the second bit $\phi_2$ of the counter 45 through a NOT gate 48. The AND gate 38 that generates the control signal $c_3$ receives the first counter bit $\phi_1$ directly at its second input. The AND gate 40 that generates the control signal $c_4$ receives at its second input the output signal of an AND gate 50 supplied at its first input with the counter bit $\phi_1$, as inverted by a NOT gate 52. The second input of the AND gate 40 receives the second counter bit $\phi_2$ directly. Lastly, the AND gate 42 that generates the control signal $c_5$ receives at its second input the output signal of an exclusive (XOR) gate 54 that receives the counter bits $\phi_1$ and $\phi_2$ at its first and second inputs, respectively.

The overall operation of the decoder 32 of FIG. 2 may best be understood from Table I which is a truth table for the various gates in the decoder for various counts of the domain counter 45.

TABLE I

| Domain Counter States | | Decoder Outputs | | | | | Clock Signals | | |
|---|---|---|---|---|---|---|---|---|---|
| $\phi_1$ | $\phi_2$ | $c_1$ | $c_2$ | $c_3$ | $c_4$ | $c_5$ | Scan Chain $12_1$ | Scan Chain $12_2$ | Scan Chain $12_n$ |
| 0 | 0 | 0 | 0 | 0 | 0 | 0 | $CK_1$ | $CK_2$ | $CK_n$ |
| 0 | 1 | 0 | 0 | 0 | 1 | 1 | $CK_1$ | 0 | 0 |
| 1 | 0 | 0 | 1 | 1 | 0 | 1 | $CK_2$ | $CK_2$ | 0 |
| 1 | 1 | 1 | 0 | 1 | 0 | 0 | $CK_n$ | $CK_n$ | $CK_n$ |

As may be appreciated from Table I, during normal operation (i.e., during non-testing intervals), the bits $\phi_1$ and $\phi_2$ of the domain counter 45 are (0,0). Consequently, the control signals $c_1$–$c_5$ are each low (zero), so the scan chains $12_1$, $12_2$ and $12_n$ receive the clock signals $CK_1$, $CK_2$ and $CK_n$, respectively.

Once the domain counter 45 generates its first count (0,1) (signifying the first test interval), the control signals $c_4$ and $c_5$ transition from a low to a high value (one). Consequently, the multiplexers 28 and 30 now both pass a ground-level clock signal to the scan chains $12_2$ and $12_n$, respectively. At this time, the control signals $c_1$ and $c_2$ remain low so the multiplexer 26 continues to pass the clock signal $CK_1$ to the scan chain $12_1$.

Upon the second count (1,0) of the domain counter 45 (signifying the second test interval), the control signals $c_2$, and $c_3$ transition from a low value to a high value. At the same time the control signal $c_4$ become low while the control signal $c_5$ remains high. As a result, the multiplexers 26 and 28 now pass the clock signal $CK_2$ to scan chains $12_1$ and $12_2$, respectively. The control signal $c_5$ still remains high at this time so the multiplexer 30 continues to pass a ground-level clock signal to the scan chain $12_n$.

Upon the third count (1,1) of the domain counter 45 (signifying the third test interval), the control signals $c_1$ and $c_3$ become high while the control signals $c_2$ and $c_5$ become low. The control signal $c_4$ remains low at this time. Under these circumstances, the multiplexers 26, 28 and 30 pass the clock signal $CK_n$ to the scan chains $12_1$, $12_2$ and $12_n$.

Figure 3A:
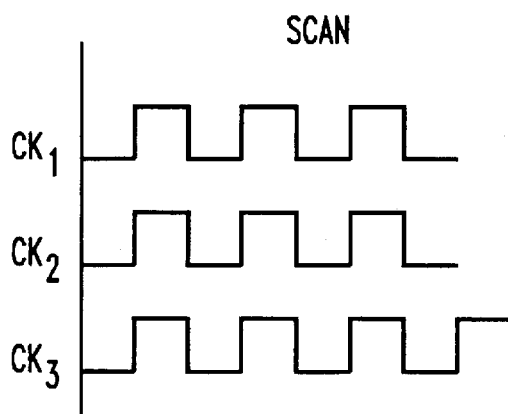
FIG. 3 shows a timing diagram of clock signals within the circuit of FIG. 1 when the clock regimes are sequentially clocked.
Figure 3B:
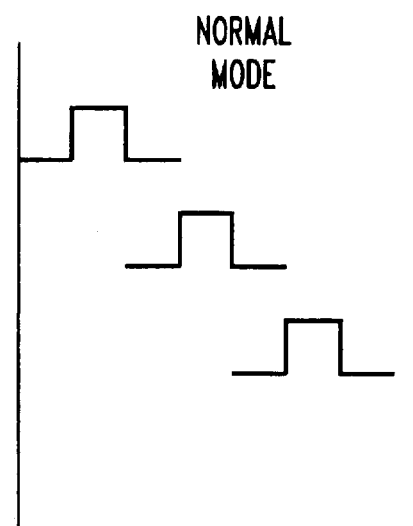

In the clocking scheme described above, no skew has been assumed between the clock signals $CK_1$–$CK_n$. In other words, the clock signals $CK_1$–$CK_n$ are presumed to be synchronized to each other. However, in practice, the clock signals $CK_1$–$CK_n$ may not be synchronized, and there may be a skew between them that may adversely affect clocking of the scan chains $12_1$–$12_n$. Referring now to FIG. 3, the problem of skew can be mitigated by generating the clock signals at least one cycle apart during the normal (test) mode, assuming that the skew between them is less than one clock cycle. However, during a scan mode, a common clock signal will typically be used to scan in data.

The foregoing describes a technique for clocking a multiple clock regime circuit wherein each successively larger groups of clock regimes are clocked at successively slower clock regimes such that each regime is clocked at no higher than its rated clock frequency.

It is to be understood that the above-described embodiments are merely illustrative of the principles of the invention. Various modifications and changes may be made thereto by those skilled in the art which will embody the principles of the invention and fall within the spirit and scope thereof. For example, while only three separate clock regimes have been disclosed, it should be understood that the invention is equally used for BIST circuits that contains a large number of such clock domains.

What is claimed is:

1. A method for supplying clock signals in a Built-In Self-Test circuit containing a plurality of clock regimes $C_1$, $C_2$, ... $C_n$ where n is an integer, each clock regime having an associated one of clock frequency $f_1$-$f_n$, respectively, such that $f_1 > f_2 > \ldots f_n$, the method comprising the steps of:

(a) supplying a clock signal $CK_i$ having a frequency $f_i$ (where i is an integer variable that is initially equal to one) to the clock regimes $C_1$–$C_i$ while holding the clock regimes $C_{i+1}$–$C_n$ constant; and (b) successively repeating step (a) after monotonically increasing i by unity one until i=n.

2. The method according to claim 1 wherein each successive clock signal $CK_{i+1}$ is synchronized to the clock signal $CK_i$.

3. The method according to claim 1 wherein each successive clock signal $CK_{i+1}$ is staggered from a preceding clock signal $CK_i$.

4. The method according to claim 1 wherein the BIST circuit contains three clock regimes (n=3) and wherein the clock signals $CK_1 CK_2$ and $CK_n$ have a frequency of 64 MHz, 32 MHz and 8 MHz, respectively.

5. Apparatus for supplying a plurality of clock regimes $C_1$, $C_2$ ... $C_n$ (where n is an integer) in a Built-In Self-Test circuit with clock signals $CK_1$–$CK_n$ having frequencies $f_1$-$f_n$, respectively, such that $f_1 > f_2 \ldots > f_n$, comprising:

means for generating n separate clock signals $CK_1$–$CK_n$, respectively, a clock multiplexer circuit for passing a prescribed one of the clock signals $CK_1$–$CK_n$ to each of the clock regimes within the Built-In Self-Test circuit;

a control circuit for controlling the clock multiplexer circuit so that the clock regimes $C_1$–$C_i$ (where i is an integer variable initially equal to unity) are supplied with the clock signal $CK_i$ while the clock regimes $C_{i+1}$–$C_n$ are held constant as i monotonically increases by unity one until 1=n.

6. The apparatus according to claim 5 wherein the clock multiplexer circuit comprises n multiplexers $M_1$–$M_n$, each multiplexer associated with one of the clock regimes $C_1$–$C_n$, for supplying that regime with a clock signal from the clock generating circuit at a frequency is no higher than a rated clock frequency associated with such clock regime.

7. The apparatus according to claim 6 wherein the control circuit comprises:

a counter for generating a monotonically increasing count having n-1 bits; and a plurality of logic gates, at least one associated with each multiplexer for controlling that multiplexer in accordance with the count of the counter.

* * * * *